(12) United States Patent
Park et al.

(10) Patent No.: US 11,223,027 B2
(45) Date of Patent: Jan. 11, 2022

(54) DISPLAY DEVICE

(71) Applicant: LG DISPLAY CO., LTD., Seoul (KR)

(72) Inventors: Hansun Park, Paju-si (KR);
Hyungseok Bang, Paju-si (KR);
Hyeongjun Lim, Paju-si (KR)

(73) Assignee: LG DISPLAY CO., LTD, Seoul (KR)

( * ) Notice: Subject to any disclaimer, the term of this patent is extended or adjusted under 35 U.S.C. 154(b) by 86 days.

(21) Appl. No.: 16/151,470

(22) Filed: Oct. 4, 2018

(65) Prior Publication Data

US 2019/0140212 A1    May 9, 2019

(30) Foreign Application Priority Data

Nov. 6, 2017  (KR) .......................... 10-2017-0146982

(51) Int. Cl.
*H01L 29/08* (2006.01)
*H01L 51/52* (2006.01)
*H01L 27/32* (2006.01)

(52) U.S. Cl.
CPC ...... *H01L 51/5253* (2013.01); *H01L 27/3276* (2013.01); *H01L 51/5246* (2013.01); *H01L 27/3223* (2013.01)

(58) Field of Classification Search
CPC ............. H01L 27/3223; H01L 27/3276; H01L 51/5253; H01L 27/3244; H01L 27/3258; H01L 51/5246
See application file for complete search history.

(56) References Cited

U.S. PATENT DOCUMENTS

| 5,701,055 | A | * | 12/1997 | Nagayama | .......... | H01L 27/3246 |
| | | | | | | 313/504 |
| 5,742,006 | A | * | 4/1998 | Grupp | .................... | G02F 1/1339 |
| | | | | | | 174/525 |
| 6,069,443 | A | * | 5/2000 | Jones | ................... | H01L 27/3283 |
| | | | | | | 313/504 |
| 6,762,552 | B1 | * | 7/2004 | Duineveld | .......... | H01L 27/3283 |
| | | | | | | 313/506 |
| 6,872,473 | B2 | * | 3/2005 | Song | ................... | H01L 51/5253 |
| | | | | | | 257/100 |

(Continued)

FOREIGN PATENT DOCUMENTS

| CN | 101336567 A | 12/2008 |
| CN | 103811530 A | 5/2014 |

(Continued)

OTHER PUBLICATIONS

Office Action dated May 21, 2018 issued in the corresponding Korean Patent Application No. 10-2017-0146982, pp. 1-5.

(Continued)

*Primary Examiner* — Jay C Kim
(74) *Attorney, Agent, or Firm* — Polsinelli PC

(57) ABSTRACT

The present disclosure includes a substrate, a moisture-transmission delay part, and a protective layer. The substrate includes a display area, and a non-display area disposed outside the display area. The moisture-transmission delay part includes a trench which is formed to surround the display area and which has a cross section in which a lower portion has a width greater than a width of an upper portion. The protective layer covers the display area and the non-display area in which the moisture-transmission delay part is formed.

7 Claims, 9 Drawing Sheets

(56) References Cited

U.S. PATENT DOCUMENTS

| | | | | |
|---|---|---|---|---|
| 6,948,993 | B2* | 9/2005 | Yi | H01L 27/3283 427/66 |
| 7,122,957 | B2* | 10/2006 | Duineveld | H01L 27/3246 313/506 |
| 7,683,537 | B2* | 3/2010 | Yoshida | H01L 27/3246 313/509 |
| 7,741,769 | B2* | 6/2010 | Hayashi | H01L 51/5253 313/498 |
| 7,902,751 | B2* | 3/2011 | Hayashi | H01L 51/5253 313/504 |
| 8,004,187 | B2* | 8/2011 | Tzen | H01L 27/322 313/498 |
| 8,111,220 | B2* | 2/2012 | Asano | H01L 27/3246 345/204 |
| 8,164,258 | B2* | 4/2012 | Hayashi | H01L 51/5253 313/512 |
| 8,203,683 | B2* | 6/2012 | Oda | G02F 1/13452 349/152 |
| 8,711,296 | B2* | 4/2014 | Tanaka | G02F 1/1345 257/277 |
| 8,823,254 | B2* | 9/2014 | Ohta | H01L 51/5275 313/503 |
| 8,981,352 | B2* | 3/2015 | Yamada | H01L 27/3211 257/40 |
| 9,128,331 | B2* | 9/2015 | Mori | G02F 1/133512 |
| 9,147,718 | B2* | 9/2015 | Kim | H01L 27/3258 |
| 9,343,700 | B2* | 5/2016 | Cho | H01L 51/5253 |
| 9,583,550 | B2* | 2/2017 | Tada | H01L 27/3279 |
| 9,627,656 | B2* | 4/2017 | Lee | H01L 51/56 |
| 9,698,389 | B2* | 7/2017 | Okamoto | H01L 51/56 |
| 9,847,508 | B2* | 12/2017 | Furuie | H05K 999/99 |
| 9,893,316 | B2* | 2/2018 | Furuie | H01L 51/5246 |
| 9,929,378 | B2* | 3/2018 | Kokame | H01L 51/5253 |
| 9,978,986 | B2* | 5/2018 | Fujita | H01L 51/5203 |
| 9,997,575 | B2* | 6/2018 | Takata | H01L 51/0003 |
| 10,032,802 | B2* | 7/2018 | Shinokawa | H05B 33/06 |
| 10,135,010 | B2* | 11/2018 | Kim | H01L 51/0017 |
| 10,205,122 | B2* | 2/2019 | Choi | H01L 51/0096 |
| 10,288,944 | B2* | 5/2019 | Jamshidi Roudbari | G02F 1/1339 |
| 10,468,623 | B2* | 11/2019 | Ajiki | H01L 51/5228 |
| 10,516,011 | B2* | 12/2019 | Lee | H01L 21/02104 |
| 10,727,448 | B2* | 7/2020 | Ichikawa | H01L 51/0008 |
| 2017/0033166 | A1* | 2/2017 | Shim | H01L 27/3279 |

FOREIGN PATENT DOCUMENTS

| | | |
|---|---|---|
| CN | 105810710 A | 7/2016 |
| CN | 106784368 A | 5/2017 |
| KR | 20050020247 A | 3/2005 |
| KR | 100643891 B1 | 11/2006 |
| KR | 20080097984 A | 11/2008 |
| KR | 20140060152 A | 5/2014 |
| KR | 20160140157 A | 12/2016 |

OTHER PUBLICATIONS

Office Action dated Oct. 25, 2018 issued in the corresponding Korean Patent Application No. 10-2017-0146982, pp. 1-5.
Chinese Office Action dated Jul. 14, 2020 issued in corresponding Patent Application No. 201811145497.0 w/English Translation (17 pages).

* cited by examiner (a)

(b)

DISPLAY DEVICE

CROSS REFERENCE TO RELATED APPLICATION

This application claims the benefit of Korean Patent Application No. 10-2017-0146982 filed on Nov. 6, 2017, which is incorporated herein by reference in its entirety for all purposes as if fully set forth herein.

BACKGROUND

Field of the Disclosure

The present disclosure relates to a display device.

Description of the Background

An organic light emitting device is a typical example of a flat display device. The organic light emitting device is formed by inserting an organic thin film layer including an organic emission layer between an anode layer and a cathode layer on a substrate. The organic light emitting device has advantages of being driven at a low voltage and implemented as a thin type, and thus, the organic light emitting device is drawing attentions as a next-generation flat display device.

The organic light emitting device is susceptible to an external material, such as humidity and oxygen, so a sealing process is required to protect the device. For this reason, a protective layer is conventionally formed on a transparent substrate, in which an organic light emitting device is formed, so as to isolate an organic light emitting device, especially an organic thin layer including an organic emission layer, from external moisture and oxygen.

However, an existing structure of a protective layer is such that a pixel area formed in a substrate is flattened and a protective layer for preventing a foreign substance from coming inside is deposited in a flattened manner. Thus, in order to prevent moisture transmission, the protective layer needs to cover an organic light emitting device and extend sufficiently toward a lateral surface of the organic light emitting device. Due to this characteristic, there is a limitation in reducing the area of the protective layer, and thus, there is a need of a solution to address this drawback.

To solve the above-described drawback, the present disclosure provides a display device which secures outdoor air barrier properties and which is capable of reducing an area of a protective layer extending toward a lateral side.

SUMMARY

To solve the above-described drawback, the present disclosure includes a substrate, a moisture-transmission delay part, and a protective layer. The substrate includes a display area, and a non-display area disposed outside the display area. The moisture-transmission delay part includes a trench which is formed to surround the display area and which has a cross section in which a lower portion has a width greater than a width of an upper portion. The protective layer covers the display area and the non-display area in which the moisture-transmission delay part is formed.

The moisture-transmission delay part may include at least two trenches.

The moisture-transmission delay part may include a partition disposed between the trenches.

The partition may include a pillar protruding from the substrate, and a head having a cross section with a width greater than a width of a cross section of the pillar.

The protective layer may include at least one inorganic protective layer and at least one organic protective layer.

Some layers in the protective layer may have areas cut off by the trench.

Some layers in the protective layer mat surround an entire inner area of the trench.

The protective layer may include: a first oxide layer formed on an organic emission layer of the substrate; an insulating layer formed on the first oxide layer; an organic protective layer formed on the insulating layer; and a second oxide layer formed on the organic protective layer.

The first oxide layer may include an area cut off by the trench, and the second oxide layer may surround an entire inner area of the trench.

The present disclosure may form a protective layer having a multi-layered structure in a manner in which a trench with a lower-portion cross section having a width greater than a width of an upper-portion cross section is formed and then the protective layer is deposited. Thus, according to a material of the protective layer, the protective layer may be in a discontinuous form cut off by the trench or may be in a form fully surrounding the trench. Accordingly, it is possible to block a penetration path of outdoor air or extend the penetration path, thereby improving outdoor air barrier properties.

In addition, the present disclosure may reduce an area of the entire protective layer by improving outdoor air barrier efficiency compared to the area of the protective layer. As a result, the non-display area is reduced and thus the freedom of design of a panel may improve.

BRIEF DESCRIPTION OF THE DRAWINGS

The accompany drawings, which are included to provide a further understanding of the disclosure and are incorporated on and constitute a part of this specification illustrate aspects of the disclosure and together with the description serve to explain the principles of the disclosure.

In the drawings.

DETAILED DESCRIPTION

Reference will now be made in detail aspects of the disclosure examples of which are illustrated in the accompanying drawings.

Hereinafter, various aspects of the present disclosure will be described with the accompanying drawings.

A light emitting display described in the following may be implemented as a TV, a video player, a personal computer (PC), a home theater, a smart phone, a virtual reality (VR) device, etc. In the following description, an organic light emitting display based on an organic light emitting diode (a light emitting device) is described as an example of the light emitting display. However, the light emitting display may be implemented based on an inorganic light emitting diode.

Figure 1:
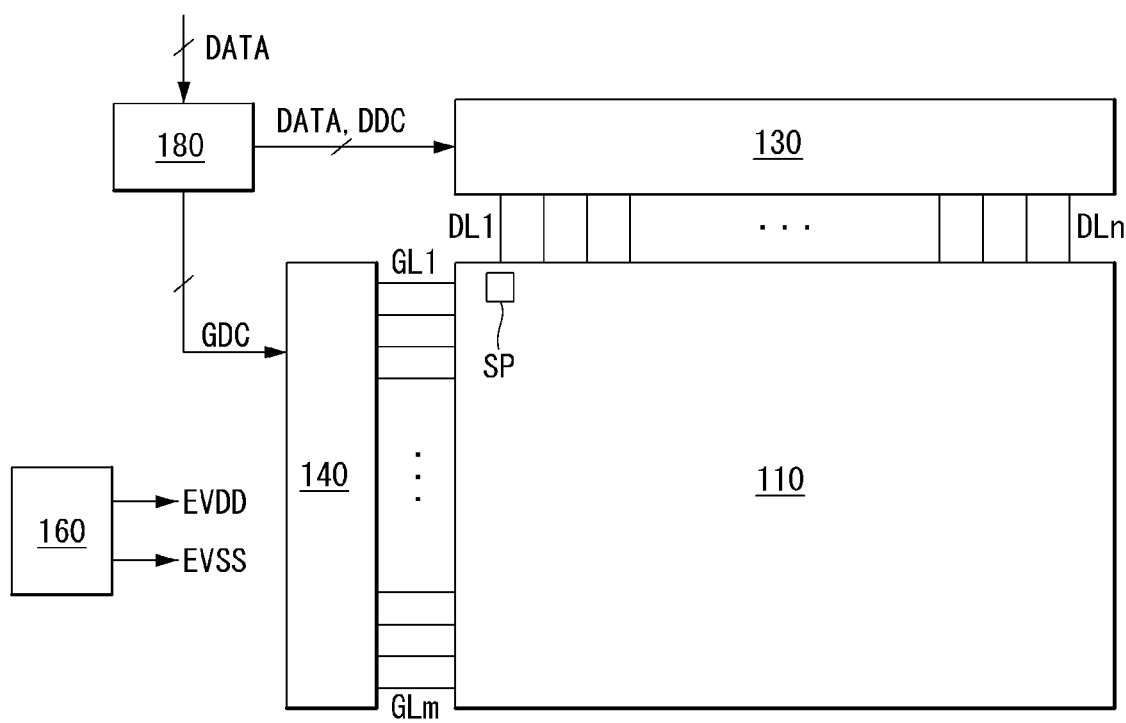
FIG. 1 is a schematic block diagram of an organic light emitting display.
Figure 2:
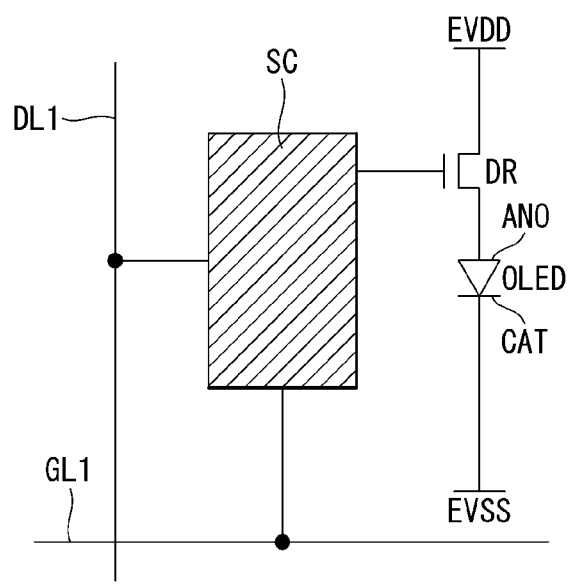
FIG. 2 is a schematic circuit diagram of a subpixel.
Figure 3:
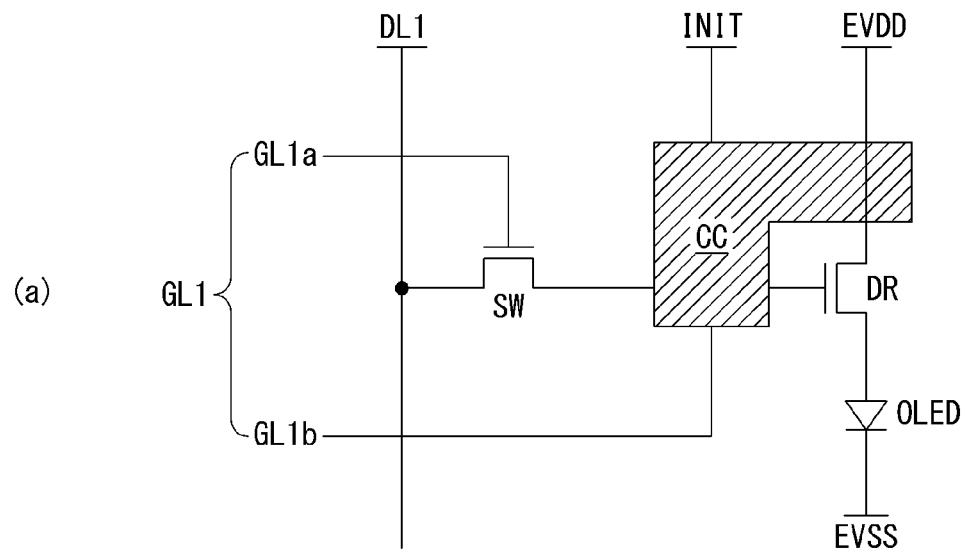
FIGS. 3(*a*) and 3(*b*) are examples of a circuit configuration illustrating part of FIG. 2.
Figure 3:
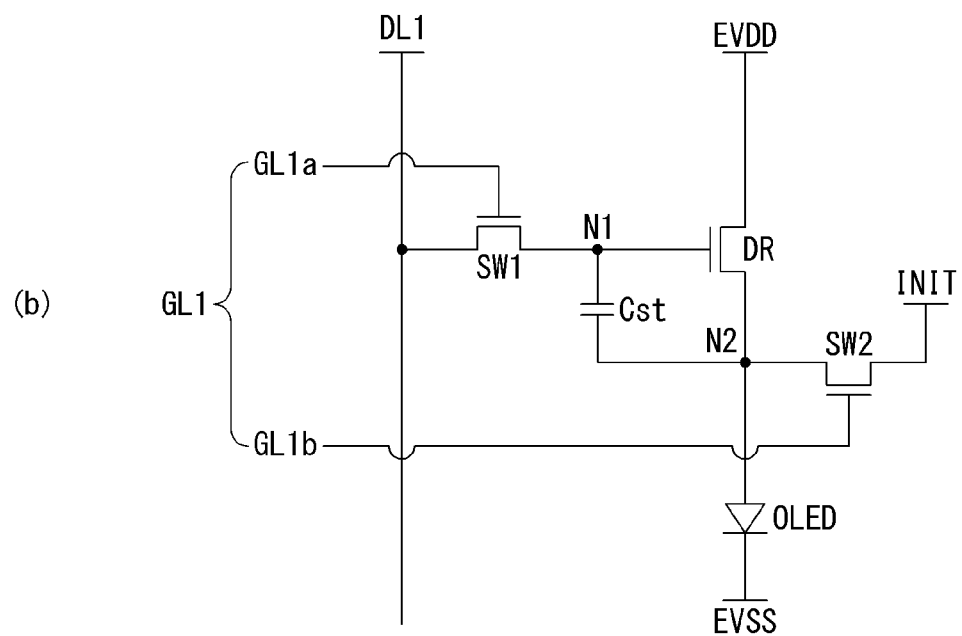
Figure 4:
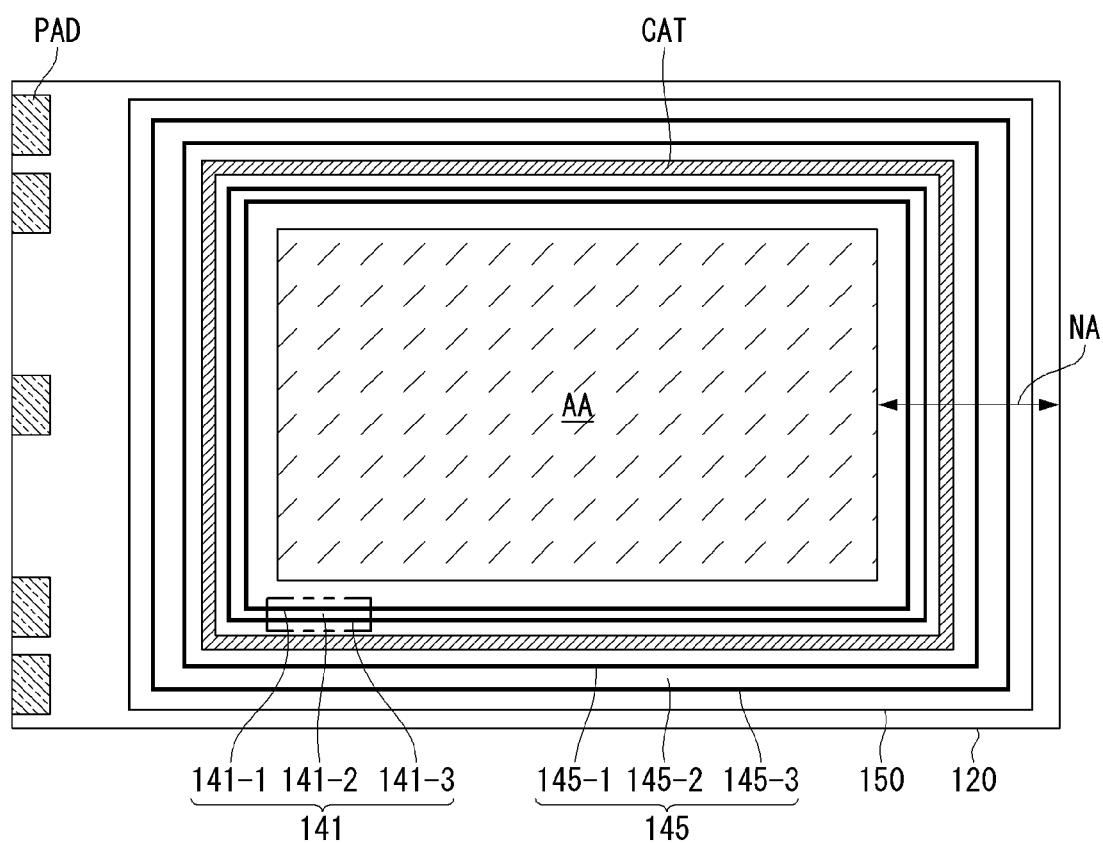
FIG. 4 is an exemplary cross-sectional view of a display panel.

FIG. 1 is a schematic block diagram of an organic light emitting display, FIG. 2 is a schematic circuit diagram of a subpixel, FIG. 3 is an example of a circuit configuration illustrating part of FIG. 2, and FIG. 4 is an exemplary cross-sectional view of a display panel.

As illustrated in FIG. 1, an organic light emitting display includes a timing controller 180, a data driver 130, a scan driver 140, a display panel 110, and a power supply 160.

The timing controller 180 is supplied from an image processing unit (not shown) with a driving signal including a data enable signal, a vertical synchronization signal, a horizontal synchronization signal, a clock signal, etc. in addition to a data signal DATA. Based on the driving signal, the timing controller 180 outputs a gate timing control signal GDC for controlling an operation timing of the scan driver 140 and a data timing control signal DDC for controlling an operation timing of the data driver 130.

In response to the data timing control signal DDC supplied from the timing controller 180, the data driver 130 samples and latches the data signal DATA supplied from the timing controller 180, converts a digital data signal into an analog data signal (or a data voltage) as a gamma reference voltage, and outputs the analog data signal. The data driver 130 outputs the data signal DATA through data lines DL1 to DLn. The data driver 130 may be in an Integrated Circuit (IC) form.

The scan driver 140 outputs scan signals in response to a gate timing control signal GDC supplied from the timing controller 180. The scan driver 140 outputs the scan signals through the scan lines GL1 to GLm. The scan driver 140 may be in an IC form or may be formed on the display panel 110 in a Gate-In-Panel (GIP) method (a method of forming a transistor by a thin layer process).

The power supply 160 outputs a high-potential voltage and a low-potential voltage. The high-potential voltage and the low-potential voltage output from the power supply 160 are supplied to the display panel 110. The high-potential voltage is supplied to the display panel 110 through a first power line EVDD, and the low-potential voltage is supplied to the display panel 110 through a second power line EVSS.

The display panel 110 displays an image based on a data signal DATA from the data driver 130, a scan signal from the scan driver 140, and power from the power supply 160. The display panel 110 includes subpixels SP operate to emit light so that an image is displayed.

The subpixels SP may include a red subpixel, a green subpixel, and a blue subpixel, or may include a white subpixel, a red subpixel, a green subpixel, and a blue subpixel. The subpixels SP may have one or more emission areas depending on emission characteristics.

As illustrated in FIG. 2, one subpixel is disposed at an intersection between a data line DL1 and a scan line GL1, and includes an Organic Light Emitting Diode (OLED) and a programming unit SC for setting a gate-source voltage of a driving transistor DR.

Transistors of a subpixel may be implemented as a p type or an n type. In addition, a semiconductor layer of a transistor of a subpixel may include amorphous silicon, poly silicon, or an oxide material. The OLED includes an anode ANO, a cathode CAT, and an organic emission layer interposed between the anode ANO and the cathode CAT. The anode is connected with the driving transistor DR.

The programming unit SC may include at least one switching transistor and at least one capacitor. The switching transistor is turned on in response to a scan signal received through a scan line GL1 to thereby apply a data voltage received through the data line DL1 to an electrode at one side of the capacitor. Based on a size of a voltage charged in the capacitor, the driving transistor DR controls an amount of currents so as to adjust an amount of light emission of the OLED. The amount of light emission of the OLED is proportional to an amount of currents supplied from the driving transistor DR. In addition, a subpixel is connected to the first power line EVDD and the second power line EVSS, and supplied with a high-potential voltage and a low-potential voltage from the first power line EVDD and the second power line EVSS.

As illustrated in FIG. 3 (a), a subpixel may include an internal compensation circuit CC in addition to the aforementioned elements such as the switching transistor SW, the driving transistor DR, the capacitor Cst, and the OLED. The internal compensation circuit CC may include one or more transistors connected to a compensation signal line INIT. The internal compensation circuit CC sets a gate-source voltage of the driving transistor DR to a voltage which reflects a threshold voltage, so that a change in luminance due to a threshold voltage of the driving transistor DR is prevented when the OLED emits light. In this case, the scan line GL1 includes at least two scan lines GL1a and GL1b to control transistors of the switching transistor SW and the internal compensation circuit CC.

As shown in FIG. 3 (b), a subpixel may include a switching transistor SW1, a driving transistor DR, a sensing transistor SW2, a capacitor Cst, and an OLED. The sensing transistor SW2 is a transistor capable of being included in an internal compensation circuit CC, and the sensing transistor SW2 performs sensing operation for compensation of the subpixel.

The switching transistor SW1 supplies a data voltage, supplied through the data line DL1, to a first node N1 in response to a scan signal supplied through the first scan line GL1a. The sensing transistor SW2 initializes or senses a second node N2 positioned between the driving transistor DR and the OLED in response to a sensing signal supplied through the second scan line GL1b.

Meanwhile, the circuit configuration of a subpixel shown in FIGS. 3(a) and 3(b) is only to provide a better understanding. That is, the circuit configuration of a subpixel according to the present disclosure is not limited thereto, and may be any of various configurations, such as 2T (Transistor)1C (Capacitor), 3T1C, 4T2C, 5T2C, 6T2C, and 7T2C.

Figure 5:
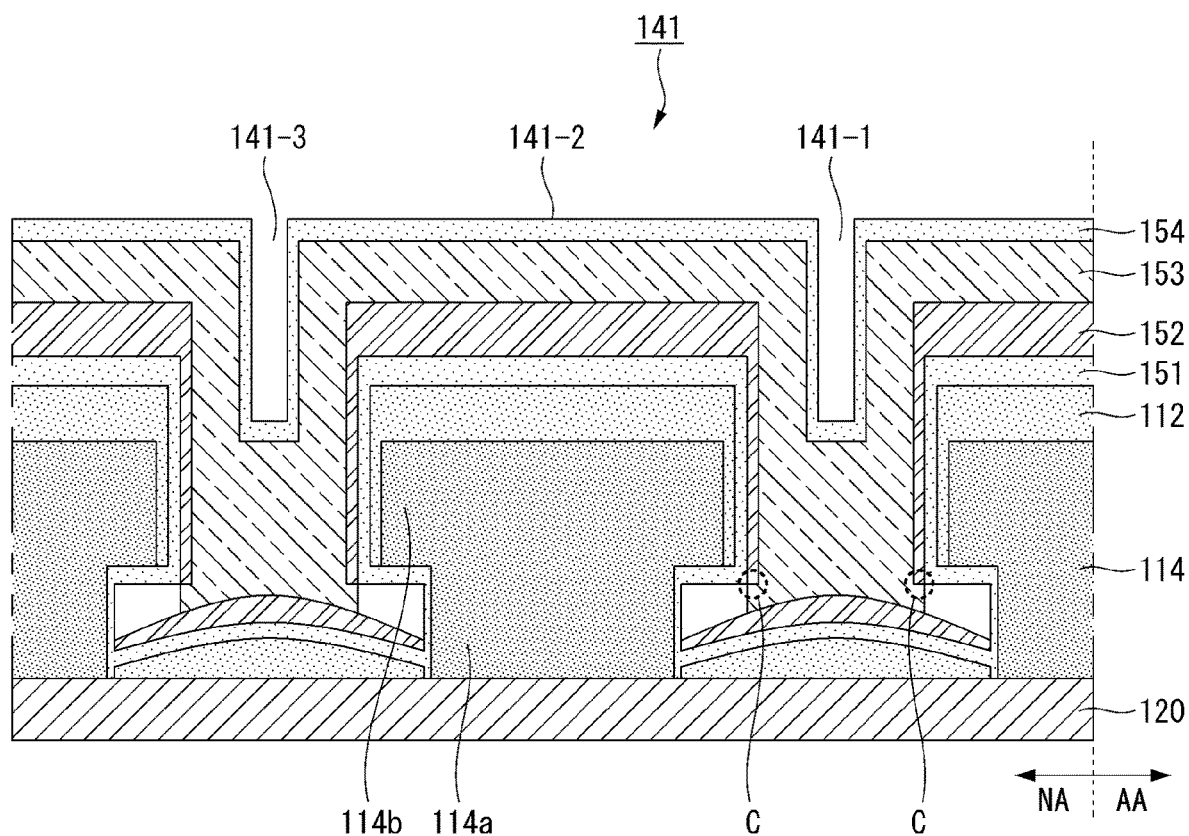
FIG. 5 is an enlarged cross-sectional view of a portion of the display panel shown in FIG. 4.

FIG. 4 is a plan view of a display panel according to an aspect of the present disclosure, and FIG. 5 is an enlarged cross-sectional view of a portion of the display panel shown in FIG. 4, which is specifically an enlarged cross-sectional view of a moisture-transmission delay part 141 (141-1, 141-2, 141-3) and 145 (145-1, 145-2, 145-3).

As illustrated in FIG. 4, a display panel according to an aspect of the present disclosure includes: a substrate 120 which includes a display area AA and a non-display area NA disposed outside the display area AA; a moisture-transmission delay part 141 and 145 which includes a trench formed in the non-display area NA; and a protective layer 150 which is formed on the substrate 120 to cover the display area and the non-display area NA in which the moisture-transmission delay part 141 and 145 is formed.

The substrate 120 is formed of a transparent resin or glass which allows light to pass therethrough. Further, the substrate 120 may be selected as a silicon wafer or the like which does not transmit light. The display area AA is composed of subpixels which emit light. A pad part PAD is composed of pads for achieving electrical connection with an external substrate. Most areas including the display area AA are sealed by the protective layer 150 to be thereby protected from moisture or oxygen. On the contrary, the pad part PAD is exposed to the outside.

The non-display area NA indicates a remaining area except the display area AA. A device for driving a pixel, such as a cathode CAT, may be formed in the non-display area NA. The non-display area may include dummy areas generated as a result of a process of forming devices for driving the display area AA.

The protective layer 150 is formed in the substrate 120 to seal the display area and the non-display area. To improve sealing effects, the present disclosure includes the moisture-transmission delay part 141 and 145 formed in the non-display area.

The moisture-transmission delay part 141 and 145 may include a trench which surrounds the display area. The moisture-transmission delay part 141 and 145 may include one or more trenches. In the case where a plurality of trenches 141-1, 141-3, 145-1, and 145-3 is formed, a partition may be formed between two trenches. As the number of trenches increases, the number of trenches and the number of partitions increase as well, thereby improving moisture permeability resistant.

As illustrated in FIG. 5, each of the trenches 141-1 and 141-3 formed in the moisture-transmission delay part 141 may include an opening which is composed of a lower portion formed in an inward direction and an upper portion protruding in an outward direction opposite to the inward direction. The cross section of each of the trenches 141-1 and 141-3 is such that a width of the lower portion adjacent to the substrate 120 is greater than a width of the upper portion having the opening and thus a greater space may be formed in the lower portion.

As a cross section of the lower portion of each the trench 141-1 and 141-3 is greater than a cross section of the upper portion, a partition 141-2 between the trench 141-1 and the trench 141-3 may have a mushroom-shaped cross section in which the cross section of the lower portion is smaller than the cross section of the upper portion. The cross section of the partition 141-2 may be in a structure which has a pillar 114a protruding from the substrate 120, and a head 114b having a cross section with a width greater than a width of the cross section of the pillar 114a.

As such, after the trenches 141-1 and 141-3 each having a lower-portion cross section greater than an upper-portion cross section is formed, the protective layer 150 is deposited. Thus, according to a material of the protective layer 150, the protective layer 150 may be in a continuous form as being cut off by the trenches 141-1 and 141-3 or may be in a form fully surrounding the trenches 141-1 and 141-3. Accordingly, a penetration path of outdoor air may extend and thus outdoor air barrier properties may improve.

The protective layer 150 is formed in the substrate 120 to seal the display area and the non-display area in which the moisture-transmission delay part 141 is formed. The protective layer 150 may be in a structure in which at least one inorganic protective layer and at least one organic protective layer 153 are deposited. The protective layer 150 may include a first oxide layer 151 formed on an organic emission layer 112, an insulating layer 152 formed on the first oxide layer 151, an organic protective layer 153 formed on the insulating layer 152, and a second oxide layer 154 formed on the organic protective layer 153.

The protective layer 150 may include the first oxide layer 151 primarily surrounding the organic emission layer 112, and the insulating layer 152. The first oxide layer 151 is formed on the organic emission layer 112. The first oxide layer 151 may be formed to surround all of the trenches 141-1 and 141-3 and the partition 141-2.

The insulating layer 152 may include SiNx and the like, and the insulating layer 152 is deposited in a CVD method. The insulating layer 152 is deposited on the head 114b of the partition 141-2 and the button surfaces of the trenches 141-1 and 141-3 but is not deposited on the pillar 114a of the partition 141-2. That is, the insulating layer 152 is deposited on the upper surface and the side surface of the head 114b of the partition 141-2 but not deposited on the pillar 114a of the partition 141-2 and again deposited on the bottom surfaces of the trenches 141-1 and 141-3. Accordingly, the insulating layer 152 is formed discontinuously as being cut off by the trenches 141-1 and 141-3, as indicated by an area c in FIG. 5.

Since the insulating layer 152 is formed in a CVD method, a thickness of the insulating layer 152 deposited on the head 114b of the partition 141-2 may be thicker than a thickness of the insulating layer 152 deposited on a lateral part of the head 114b.

Due to the first oxide layer 151 and the insulating layer 152 formed as described above, moisture transmission may be prevented primarily. Moisture transmission to the first oxide layer 151 and the insulating layer 152 in the non-display area NA does not affect the display area AA. The first oxide layer 151 may include an oxide material such as $Al_2O_3$, and the insulating layer 152 may include SiNx and the like.

The organic protective layer 153 formed on the insulating layer 152 relieves stress of each layer, and the second oxide layer 154 plays a role of preventing moisture transmission in a last stage As such, as the first oxide layer 151 and the second oxide layer 154 susceptible to humidity are formed to surround all of the trenches 141-1 and 141-3 and the partition 141-2, a moisture transmission path is lengthened. Thus, even when moisture transmission occurs on a lateral surface of the second oxide layer 154 of the protective layer 150, it is possible to reduce a probability of the moisture to approach toward the display area AA.

In addition, each of the insulating layer 152 and the organic emission layer 112 are cut off by the trenches 141-1 and 141-3 and thus moisture is prevented from being diffused in a device, thereby improving moisture permeability resistant.

Figure 6:
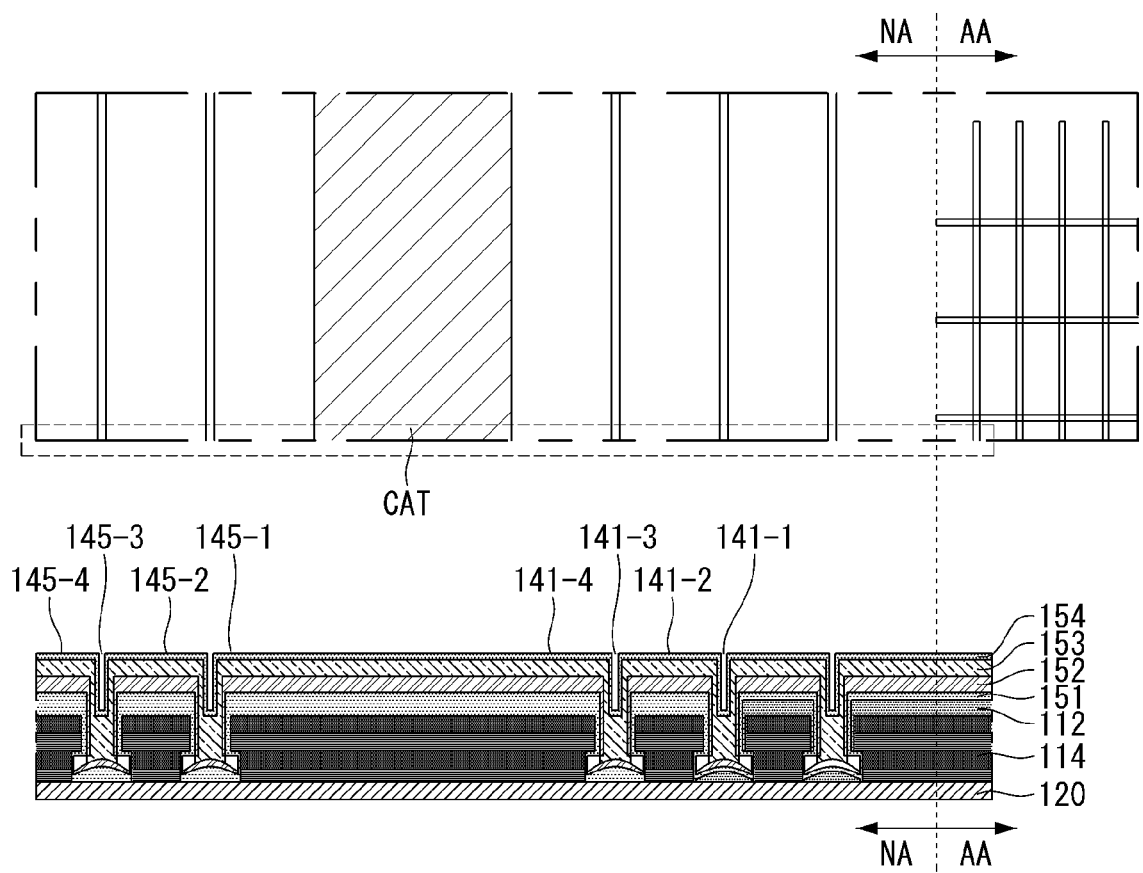
FIG. 6 is a diagram for explaining a structure of a moisture-transmission delay part of a display panel according to an aspect of the present disclosure.

FIG. 6 is a diagram for explaining a structure of the moisture-transmission delay part 141 and 145 of the display panel according to an aspect of the present disclosure, and the diagram shows a plan view of the display panel and a cross-sectional view corresponding thereto.

A device for driving a pixel, such as a cathode CAT, may be formed in the non-display area NA. The non-display area may include dummy areas generated as a result of a process of forming devices for driving the display area AA.

The moisture-transmission delay part 141 and 145 may include a plurality of trenches 141-1, 141-3, 145-1, and 145-3 surrounding the display area AA. A cross section of each of the trenches 141-1 and 141-3 is such that a width of the lower portion adjacent to the substrate 120 is greater than a width of the upper portion having the opening and thus a greater space may be formed in the lower portion. As a cross section of the lower portion of each the trench 141-1 and 141-3 is greater than a cross section of the upper portion, partitions 141-2 and 141-5 between the trenches each may have a mushroom-shaped cross section in which the cross section of the lower portion is smaller than the cross section of the upper portion. The trenches 141-1, 141-3, 145-1, and 145-3 and the partitions 141-2 and 145-2 may vary in size and number according to the size of the non-display area.

The protective layer 150 is formed on the moisture-transmission delay part 141 and 145, and the protective layer 150 may include a plurality of inorganic protective layers and organic protective layers. As an example of the protective layer 150, the first oxide layer 151 and the insulating layer 152 may primarily surround an organic emission layer to primarily prevent moisture transmission. Then, an organic protective layer 153 may be deposited to relieve stress of each layer, and a second oxide layer 154 may be deposited to prevent moisture transmission in a last stage. Such configuration is merely exemplary, and a type and a function of a material of each layer and the number of the protective layer 150 may vary.

The first oxide layer 151 is a layer of Al2O3 having a good step coverage. The first oxide layer 151 is deposited along wall surfaces of the partitions 141-2 and 145-2 and the trenches 141-1, 141-3, 145-1, and 145-3. The CVD deposited insulating layer 152 may be deposited on respective head parts of the partitions 141-2 and 145-2, and respective bottom parts of the trenches 141-1, 141-3, 145-1, and 145-3.

The organic protective layer 153 may be a liquid type and filled in the trenches 141-1, 141-3, 145-1, and 145-3, and the second oxide layer 154 may be deposited thereon. In the case where the moisture-transmission layer part 141 and 145 are applied to the display area AA, it is possible to manufacture the display area AA and the non-display area NA at the same time.

As such, the sealed structure having the moisture-transmission delay part applied therein lengthens a moving path of a permeated material, thereby efficiently preventing external moisture transmission. In addition, it is possible to prevent the non-display area from increasing, by reducing a gap between and the most lateral outer oxide layer and an organic film.

FIGS. 7 to 12 are schematic process cross-sectional views of a subpixel for implementing a display device according to an aspect of the present disclosure.

Figure 7:
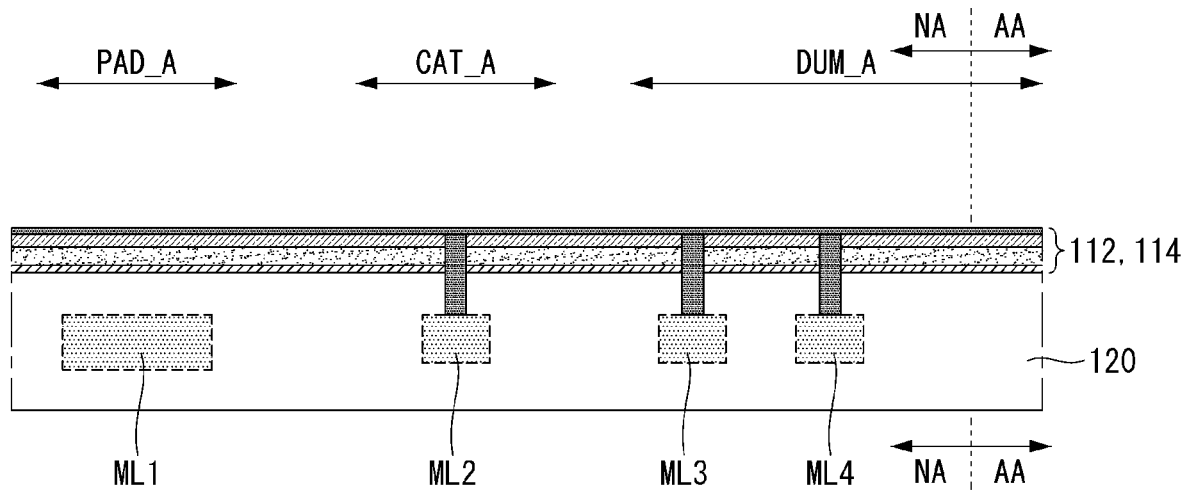
FIGS. 7 to 12 are schematic process cross-sectional views of a subpixel for implementing a display device according to an aspect of the present disclosure.

Referring to FIG. 7, a display panel includes an organic emission layer 1120 formed in a substrate 120, and the display panel may be classified into a display area AA and a non-display area NA according to where pixels are formed.

The non-display area NA includes components for driving the display panel, such as metals ML1, ML2, ML3, and ML4, and a cathode area CAT_A, a pad area PAD_A, and a dummy area DUM_A may be formed in the non-display area NA.

Figure 8:
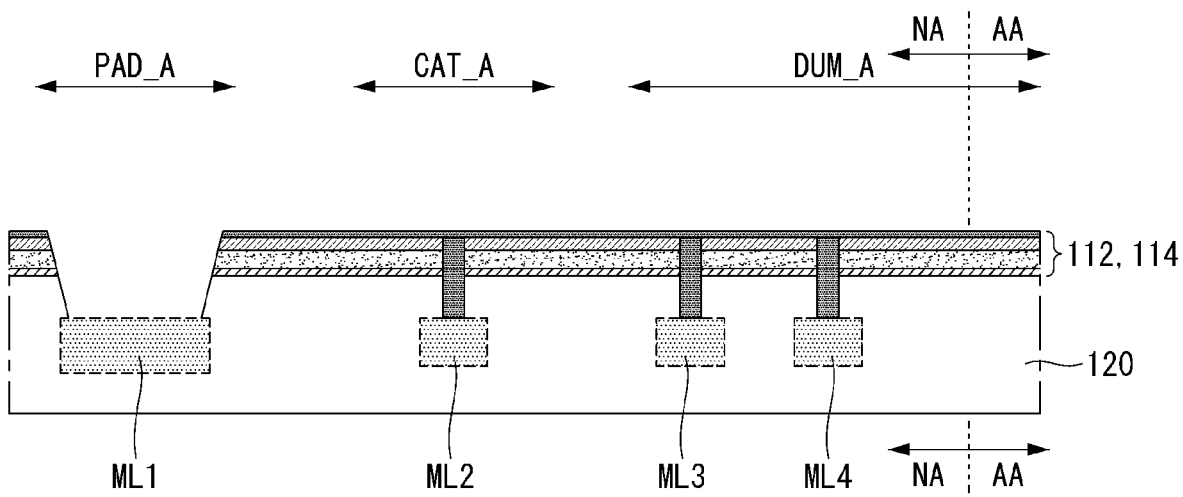

If the sealed structure of the present disclosure is applied to the display panel, it is possible to expose a pad part PAD by etching the pad area PAD_A through photolithography and etching processes, as shown in FIG. 8.

Figure 9:
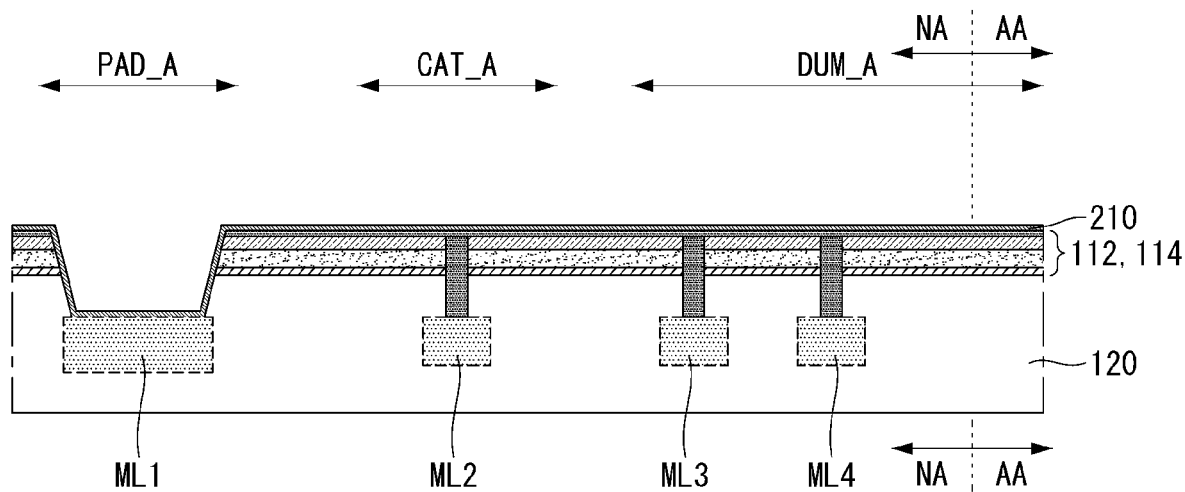

Next, as shown in FIG. 9, an oxynitride film SiN 210 for contact metals, such as a contact metal and a via metal, is formed.

Figure 10:
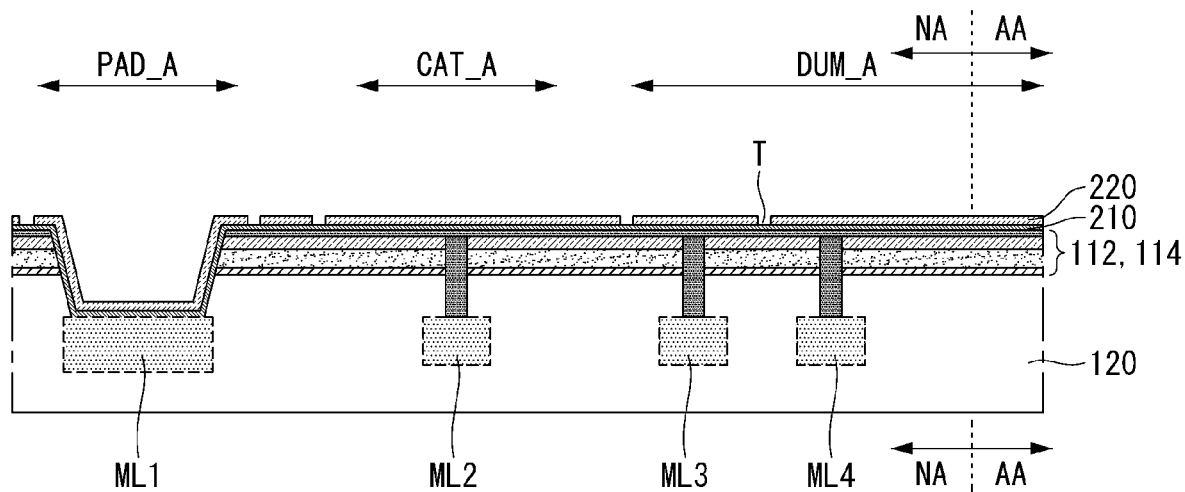
Figure 11:
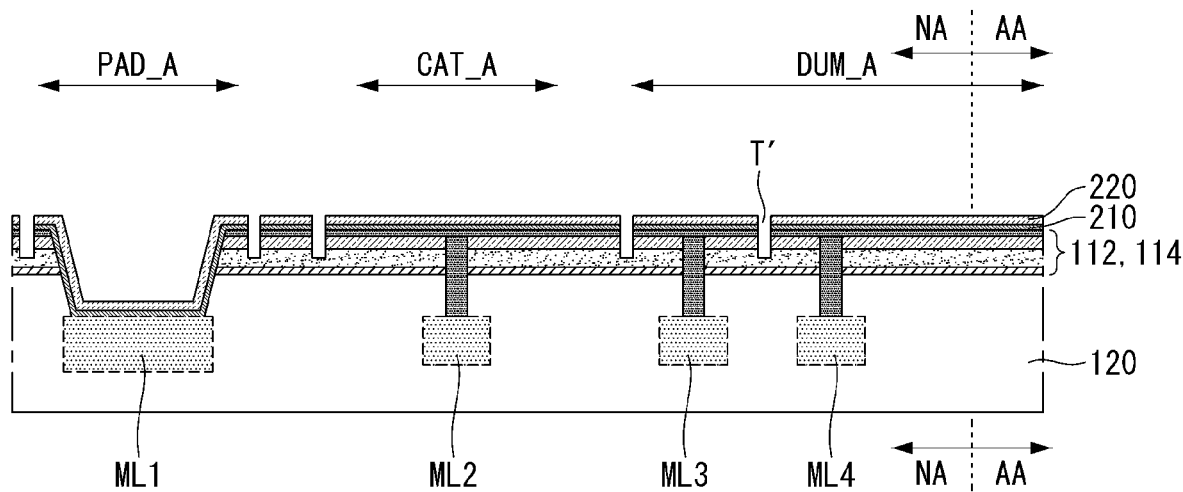

As illustrated in FIG. 10, a photo process using a mask 220 for forming a trench is performed to thereby form a trench T as illustrated n FIG. 11.

Figure 12:
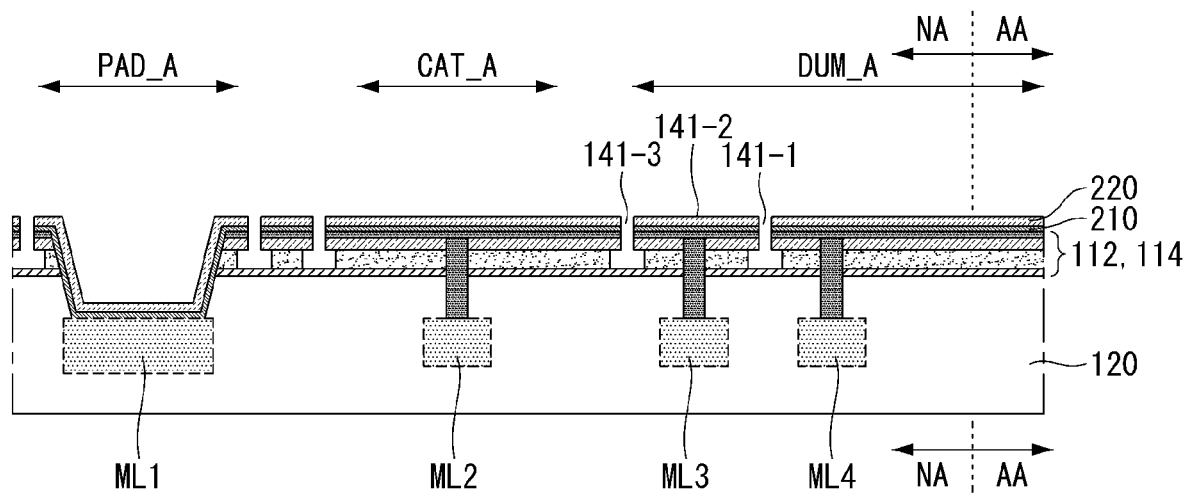

Next, an undercut process is performed using enchant to make a lower portion of a trench to have a width greater than a width of an upper portion of the trench, thereby completing the trenches 141-1 and 141-3 as illustrated in FIG. 12.

As such, the present disclosure includes a moisture-transmission delay part formed in a substrate including a display area and a non-display area, the moisture-transmission delay part which includes a trench in which an upper portion having an opening has a width greater than a width of a lower portion. In addition, the present disclosure includes a protective layer formed to cover the display area and the non-display area in which the moisture-transmission delay part is formed, thereby securing outdoor air barrier properties and reducing an area of the protective layer extending to an area of a lateral surface. In addition, by reducing the area of the protective layer, it is possible to reduce the non-display area to thereby reduce the size of a display device and improve the freedom of design of a panel.

While this disclosure has been described in connection with what is presently considered to be practical exemplary aspects, it is to be understood that the disclosure is not limited to the disclosed aspects, but, on the contrary, is intended to cover various modifications and equivalent arrangements included within the spirit and scope of the appended claims. As the exemplary aspects may be implemented in several forms without departing from the characteristics thereof, it should also be understood that the above-described aspects are not limited by any of the details of the foregoing description, unless otherwise specified, but rather should be construed broadly within its scope as defined in the appended claims. Therefore, various changes and modifications that fall within the scope of the claims, or equivalents of such scope are therefore intended to be embraced by the appended claims.

What is claimed is:

1. A display device comprising:
a display area comprising subpixels and a non-display area disposed outside the display area;
a moisture-transmission delay part comprising first and second trenches formed at the non-display area to surround the display area and a partition disposed along respective boundaries of the first and second trenches,
wherein the first trench encloses the display area and the second trench encloses the first trench and the partition;
wherein the partition includes a pillar protruding from the substrate and a head disposed on the pillar having a cross-section with a width greater than a width of a cross-section of the pillar,
wherein the first and second trenches have a cross-section with a width of a top smaller than a width of a bottom; and
a protective layer covering the display area and the non-display area at which the moisture-transmission delay part is formed,
wherein the protective layer comprises a plurality of layers, wherein one of the plurality of layers is a discontinuous layer.

2. The display device of claim 1, wherein the protective layer includes at least one inorganic protective layer and at least one organic protective layer.

3. The display device of claim 2, wherein the at least one inorganic protective layer is the discontinuous layer.

4. The display device of claim 2, wherein the at least one organic protective layer covers the bottom surface area and the areas of the sidewall surfaces of the first and second trenches.

5. The display device of claim 1, wherein the protective layer further comprises:

a first oxide layer formed on the display area and the non-display area at which the moisture-transmission delay part is formed;

an insulating layer formed on the first oxide layer;

an organic protective layer formed on the insulating layer; and a second oxide layer formed on the organic protective layer.

6. The display device of claim 5, wherein the insulating layer covers an upper surface and a side surface of the first oxide layer and is the discontinuous layer.

7. The display device of claim 1, wherein the first and second trenches disposed in the moisture-transmission delay part include a first opening at a bottom portion formed in an inward direction and a second opening protruding in an outward direction opposite to the inward direction.

* * * * *